(12) United States Patent
Wu

(10) Patent No.: US 6,204,109 B1
(45) Date of Patent: Mar. 20, 2001

(54) METHOD FOR FORMING A CYLINDRICAL CAPACITOR

(75) Inventor: Der-Yuan Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/309,973

(22) Filed: May 11, 1999

(51) Int. Cl.$^7$ .............................................. H01L 21/8234
(52) U.S. Cl. ............................................ 438/238; 438/238
(58) Field of Search ................................... 438/238, 239, 438/240, 253, 254, 381, 393, 396, 397, 703, 720, 398, 399

(56) References Cited

U.S. PATENT DOCUMENTS

| | | | |
|---|---|---|---|
| 5,811,331 | * | 9/1998 | Ying et al. ............................. 438/253 |
| 5,902,126 | * | 5/1999 | Hong et al. ........................... 438/396 |
| 5,930,621 | * | 7/1999 | Kang et al. ............................ 438/253 |
| 6,025,246 | * | 2/2000 | Kim ....................................... 438/396 |

* cited by examiner

Primary Examiner—David Nelms
Assistant Examiner—David Nhu

(57) ABSTRACT

A method for forming a cylindrical capacitor of a dynamic random access memory cell is disclosed. The method includes firstly providing a semiconductor substrate having a dielectric layer thereon, at least one contact hole formed in the dielectric layer, wherein the contact hole extends from the top surface of the dielectric layer to the surface of the substrate. Next, a conductive layer is formed on the dielectric layer, and a blocking layer is further formed on the conductive layer. The conductive layer fills the contact hole, wherein at least one trench is formed in the blocking layer and a portion of the conductive layer, and wherein the trench locates approximately above the contact hole. Finally, an oxide layer is formed on the inner surface of the trench; and the blocking layer and a portion of the conductive layer are etched using the oxide layer as a mask, thereby forming a cylindrical electrode of the capacitor.

10 Claims, 3 Drawing Sheets

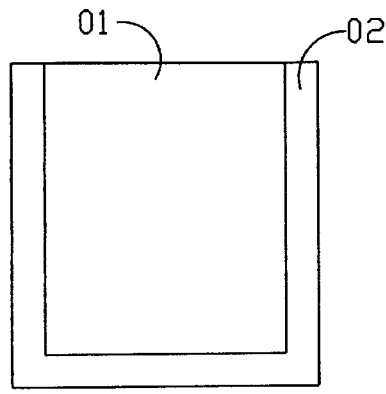
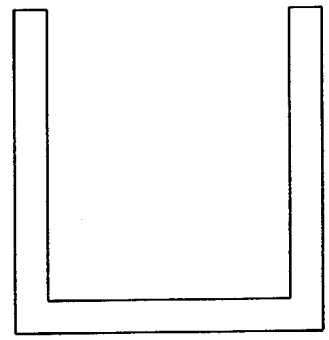
FIG.1A(Prior Art)   FIG.1B(Prior Art)
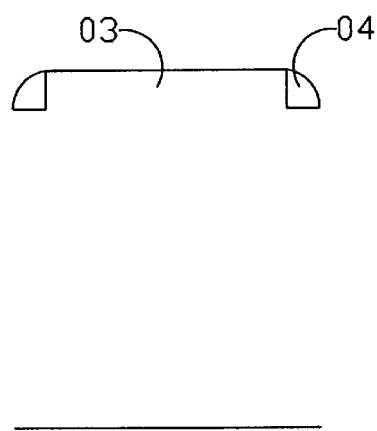
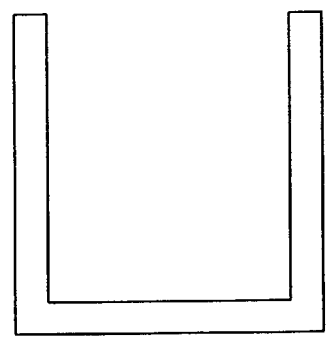
FIG.2A(Prior Art)   FIG.2B(Prior Art)

METHOD FOR FORMING A CYLINDRICAL CAPACITOR

BACKGROUND OF THE INVENTION

1. Field of the Invention

The present invention relates to semiconductor capacitors, and more particularly to a method for forming a cylindrical capacitor of a dynamic random access memory cell.

2. Description of the Prior Art

Demand for dynamic random access memories (DRAMs) has rapidly increased owing to widespread use of integrated circuits. Each cell of the DRAM includes transistors and a capacitor, which is used for the purpose of charge storage. As the DRAM becomes highly integrated, the area occupied by the capacitor of the DRAM storage cell shrinks, thus decreasing the capacitance of the capacitor owing to its smaller electrode surface area. In order to reduce the cell dimension and yet obtain a high capacitance, the cylinder-shaped capacitor, which includes an inner surface in addition to an outer surface, was disclosed to increase the surface area of the capacitor electrode.

Unfortunately, the conventional cylindrical capacitor suffers complex and complicated processing steps, and generates DRAM cells with low quality. A conventional process for forming a cylindrical capacitor includes firstly providing a substrate having transistors manufactured thereon, followed by forming a dielectric layer having contact hole therein. Subsequently, a polysilicon layer is deposited on the dielectric layer and also fills the contact holes. Based on this polysilicon layer, a combination of oxide layer formation, etching stop layer formation, polysilicon layer formation, planarization technique, photolithography and etch process is repeatedly performed in order to finally form a cylindrical structure as shown in FIG. 1A. This resultant structure consists of a silicon oxide pillar 01 surrounded by polysilicon 02. After removing the polysilicon 02, a cylindrical polysilicon electrode is thus achieved as shown in FIG. 1B. Due to the complex and complicated processing steps, the fabricated DRAM capacitors are apt to suffer defects. More specifically, a silicon nitride layer is required to provide as an etch stop while removing unwanted polysilicon. The silicon nitride layer further requires planarization process such as chemical mechanical polishing (CMP). Moreover, as the cylindrical polysilicon electrode takes shape in a number of steps, the joints inside the cylindrical polysilicon electrode are not strong enough to resist pressure, thus decreasing manufacturing throughput and product quality.

FIGS. 2A and 2B demonstrate another conventional method for forming a cylindrical capacitor. In this method, a spacer 04 composed of silicon oxide or silicon nitride is formed over a polysilicon layer 03. After etching the polysilicon layer 03 using the spacer 04 as a mask, a resultant cylindrical capacitor electrode is achieved. This method disadvantageously requires deposition and etching back for forming the spacer. Furthermore, the width of the spacer is not practically controllable in a predetermined manner, thereby usually resulting in a cylindrical capacitor having horn formation on top of the capacitor, which is apt to be broken into fragments, thus complicating the subsequent process.

For the foregoing reasons, there is a need for a method of forming a cylindrical capacitor of a dynamic random access memory cell, so that the process can be simplified, and the manufacturing throughput and product quality can be increased.

SUMMARY OF THE INVENTION

In accordance with the present invention, a method is provided for forming a cylindrical capacitor of a dynamic random access memory cell that substantially simplifies the process and increases he manufacturing throughput and product quality. In one embodiment, a semiconductor substrate having a dielectric layer thereon is firstly provided, and at least one contact hole is formed in the dielectric layer. The contact hole extends from a top surface of the dielectric layer to a surface of the substrate. Next, a polysilicon layer is formed on the dielectric layer, and a silicon nitride layer is then formed on the polysilicon layer. The polysilicon layer fills the contact hole, wherein at least one trench is formed in the silicon nitride layer and a portion of the polysilicon layer, and wherein the trench locates approximately above the contact hole. Thereafter, an implantation (for example, P$^+$)impurity-enhanced oxide layer is thermally formed on inner surface of the trench. Finally, the silicon nitride layer and a portion of the polysilicon layer are etched using the oxide layer as a mask, thereby forming a cylindrical electrode of the capacitor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A shows a cross-sectional view illustrative of a conventional method for forming a cylindrical capacitor;

FIG. 1B shows cross-sectional view of a resultant structure in connection with the method of FIG. 1A;

FIG. 2A shows a cross-sectional view illustrative of another conventional method for forming a cylindrical capacitor;

FIG. 2B shows cross-sectional view of a resultant structure in connection with the method of FIG. 2A;

DESCRIPTION OF THE PREFERRED EMBODIMENT

Figure 3:
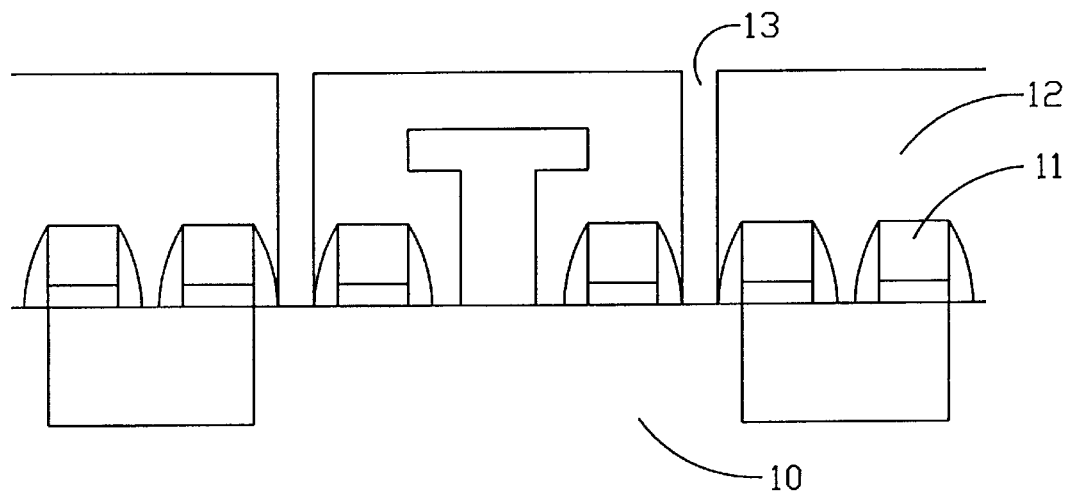
FIG. 3 shows cross-sectional view demonstrative of the provided substrate and transistors in accordance with one embodiment of the present invention.

Referring to FIG. 3, metal-oxide-semiconductor (MOS) transistors 11 are conventionally formed in and on a silicon substrate 10. Further, a silicon oxide layer 12 is formed as a dielectric layer over the MOS transistors 11 using a chemical vapor deposition (CVD) method. Contact holes 13 are formed in the dielectric layer 12, and each extends from the top surface of the dielectric layer 12 to the surface of the substrate 10.

Figure 4:
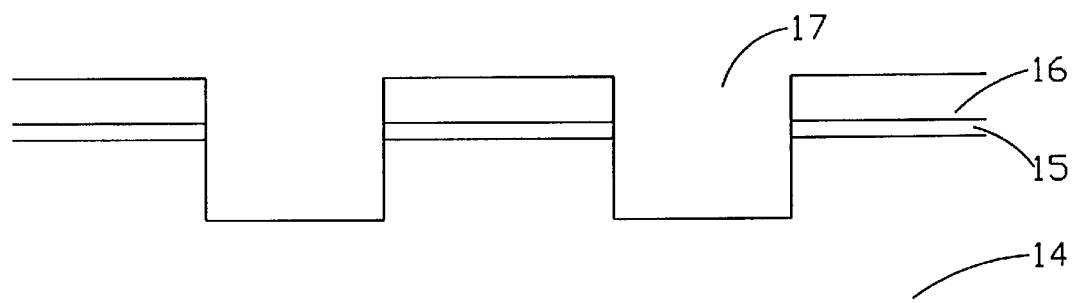
FIG. 4 shows cross-sectional view demonstrative of the formed trench in accordance with the embodiment of the present invention.
Figure 4:
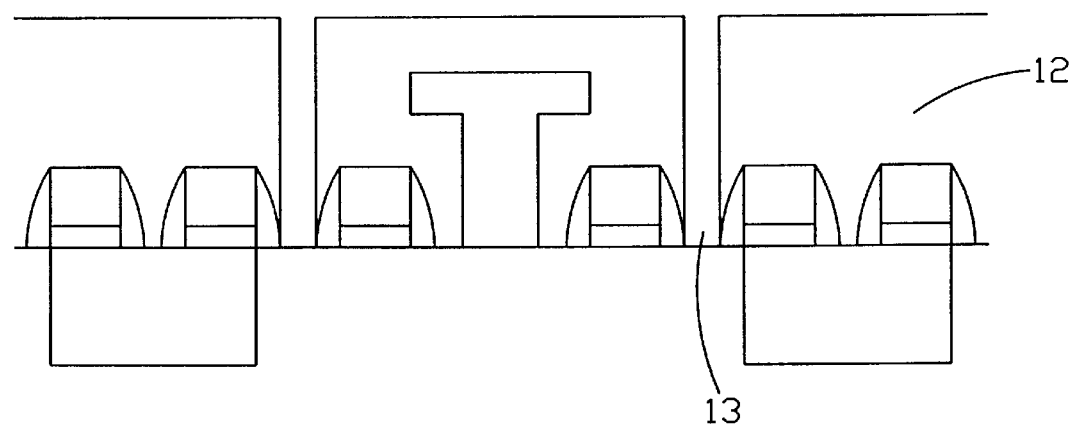

A polysilicon layer 14 is deposited on the dielectric layer 12 using a conventional chemical vapor deposition method as shown in FIG. 4. It is noted that the polysilicon layer 14 also fills the contact holes 13. A silicon nitride layer 15 is then deposited on the polysilicon layer 14. It is appreciated that other material other than silicon nitride, such as SiON, can alternatively be used. A photoresist layer 16 is then formed and patterned on the silicon nitride layer 15 using conventional photolithography techniques, defining a bottom electrode area of a dynamic random access memory (DRAM) capacitor approximately above the contact holes 13. A conventional anisotropic etching process is then performed on the silicon nitride layer 15 and part of the polysilicon layer 14, therefore forming trenches 17 in the silicon nitride layer 15 and part of the polysilicon layer 14. Subsequently, Ar and $P^+$ ions are implanted into the inner surface of the trench of the polysilicon layer 14. This implantation is preferably performed at a tilt angle, so that the ions can be uniformly implanted onto the inner surface.

Figure 5:
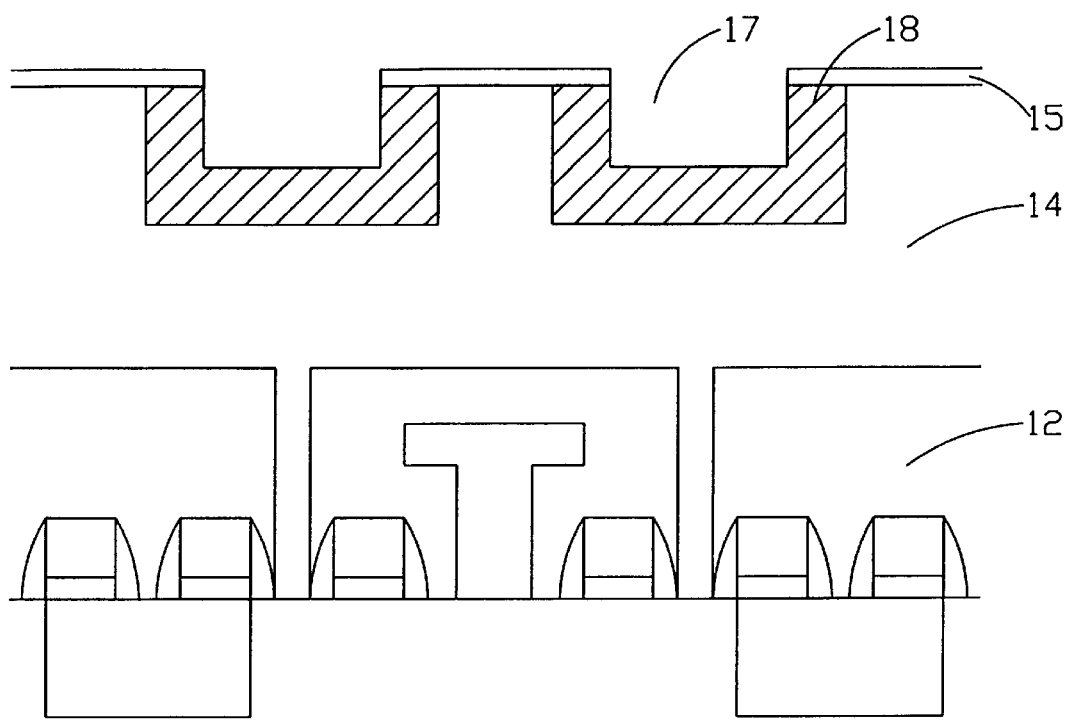
FIG. 5 shows cross-sectional view demonstrative of the formed implantation-impurity-enhanced thermal oxide layer in accordance with the embodiment of the present invention.

Referring to FIG. 5, after striping the photoresist layer 16, a thermal process is executed to form an implantation-impurity-enhanced thermal oxide layer 18 on the inner surface of the trench 17 by converting the implanted ions. It is also noted that a major portion of the polysilicon layer 14 does not induce oxidation because of the blocking of the silicon nitride layer 15.

Figure 6:
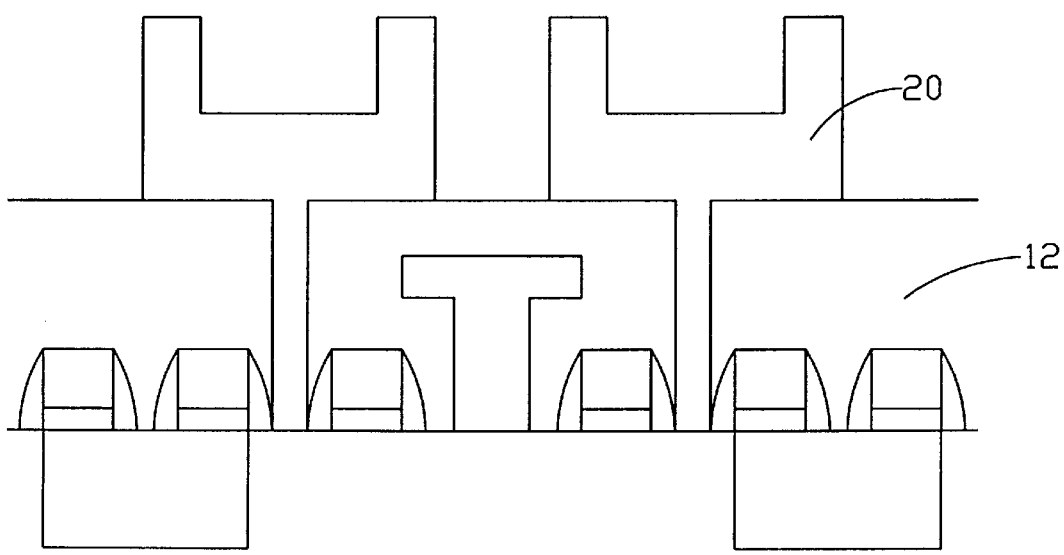
FIG. 6 shows cross-sectional view demonstrative of the resultant cylindrical electrode in accordance with the embodiment of the present invention.

The silicon nitride layer 15 is removed, and the polysilicon layer 14 is etched using the thermal oxide layer 18 as an etch mask. The etching of the silicon nitride layer 15 and the polysilicon layer 14 is performed by a conventional etch process, such as a wet etch or a dry etch. Consequently, cylindrical electrodes 20 for the DRAM capacitors are thus generated as shown in FIG. 6. The configuration ratio of this cylindrical electrode 20 can be conventionally managed by controlling the etch selectivity of the silicon oxide to the polysilicon. More specifically, in the etch step mentioned above, the bottom of the thermal oxide layer 18 is eventually etched away, while major portion of the vertical sidewall of the thermal oxide layer 18 remains throughout the etching due to its higher thickness. Furthermore, the formation of the cylindrical electrode is achieved owing to the fact that the silicon oxide can be controllably etched more slowly than the polysilicon.

According to the present invention, the cylindrical electrode of the DRAM capacitors is taken shape in one step, resulting in a structure that can resist more stress than that of prior art. Further, the horn formation problem in the prior art can be effectively eliminated, increasing manufacturing throughput and product quality.

Although specific embodiments have been illustrated and described, it will be obvious to those skilled in the art that various modifications may be made without departing from what is intended to be limited solely by the appended claims.

What is claimed is:

1. A method for forming a cylindrical capacitor, said method comprising:

provoding a semiconductor substrate having a dielectric layer thereon, at least one contact hole formed in the dielectric layer, wherein said contact hole extends from a top surface of the dielectric layer to a surface of said substrate;

forming a polysilicon layer on the dielectric layer, and a silicon nitride layer on said polysilicon layer, said polysilicon layer filling said contact hole, wherein at least one trench is formed in the silicon nitride layer and a portion of the polysilicon layer, and wherein said trench locates approximately above said contact hole;

thermally forming an implantation-impurity-enhanced oxide layer on inner surface of said trench; and etching said silicon nitride layer and a portion of said polysilicon layer using said oxide layer as a mask, thereby forming a cylindrical electrode of the capacitor.

2. The method according to claim 1, wherein said substrate comprises a metal oxide semiconductor transistor.

3. The method according to claim 1, wherein said dielectric layer is formed by chemical vapor deposition.

4. The method according to claim 1, wherein said dielectric layer comprises silicon oxide.

5. The method according to claim 1, wherein said polysilicon layer is formed by chemical vapor deposition.

6. The method according to claim 1, wherein said silicon nitride layer is formed by chemical vapor deposition.

7. The method according to claim 1, wherein said trench is formed by etch.

8. The method according to claim 1, wherein said etching of the silicon nitride layer and the polysilicon layer is performed by dry etch or wet etch.

9. The method according to claim 1, wherein ions used for forming the implantation-impurity-enhanced oxide layer comprise $P^+$.

10. The method according to claim 1, wherein said implantation-impurity-enhanced oxide layer comprises silicon oxide.

* * * * *